United States Patent
Mishra et al.

(10) Patent No.: US 11,450,638 B2
(45) Date of Patent: Sep. 20, 2022

(54) BUMP BOND STRUCTURE FOR ENHANCED ELECTROMIGRATION PERFORMANCE

(71) Applicant: Texas Instruments Incorporated, Dallas, TX (US)

(72) Inventors: Dibyajat Mishra, Fremont, CA (US); Ashok Prabhu, San Jose, CA (US); Tomoko Noguchi, Beppu (JP); Luu Thanh Nguyen, San Jose, CA (US); Anindya Poddar, Sunnyvale, CA (US); Makoto Yoshino, Beppu (JP); Hau Nguyen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 196 days.

(21) Appl. No.: 17/009,648

(22) Filed: Sep. 1, 2020

(65) Prior Publication Data
US 2020/0402938 A1 Dec. 24, 2020

Related U.S. Application Data

(63) Continuation of application No. 16/047,888, filed on Jul. 27, 2018, now Pat. No. 10,763,231.

(51) Int. Cl.
*H01L 23/00* (2006.01)
*H01L 23/495* (2006.01)
*H01L 23/31* (2006.01)

(52) U.S. Cl.
CPC .......... *H01L 24/13* (2013.01); *H01L 23/3157* (2013.01); *H01L 23/49582* (2013.01);
(Continued)

(58) Field of Classification Search
CPC ............. H01L 24/13; H01L 23/3157; H01L 23/49582; H01L 24/81; H01L 2224/13147;
(Continued)

(56) References Cited

U.S. PATENT DOCUMENTS 8,592,995 B2 11/2013 Lin et al.
8,952,267 B2 2/2015 Chen et al.
(Continued)

FOREIGN PATENT DOCUMENTS

TW 201123325 A 7/2011

*Primary Examiner* — Caleen O Sullivan
(74) *Attorney, Agent, or Firm* — Dawn Jos; Charles A. Brill; Frank D. Cimino

(57) ABSTRACT

A microelectronic device has a pillar connected to an external terminal by an intermetallic joint. Either the pillar or the external terminal, or both, include copper in direct contact with the intermetallic joint. The intermetallic joint includes at least 90 weight percent of at least one copper-tin intermetallic compound. The intermetallic joint is free of voids having a combined volume greater than 10 percent of a volume of the intermetallic joint; and free of a void having a volume greater than 5 percent of the volume of the intermetallic joint. The microelectronic device may be formed using solder which includes at least 93 weight percent tin, 0.5 weight percent to 5.0 weight percent silver, and 0.4 weight percent to 1.0 weight percent copper, to form a solder joint between the pillar and the external terminal, followed by thermal aging to convert the solder joint to the intermetallic joint.

15 Claims, 6 Drawing Sheets

(52) U.S. Cl.
CPC ...... *H01L 24/81* (2013.01); *H01L 2224/1368* (2013.01); *H01L 2224/13147* (2013.01); *H01L 2224/13564* (2013.01); *H01L 2224/13582* (2013.01); *H01L 2224/13611* (2013.01); *H01L 2224/13639* (2013.01); *H01L 2224/13647* (2013.01); *H01L 2224/13655* (2013.01); *H01L 2224/13657* (2013.01); *H01L 2224/13684* (2013.01); *H01L 2224/81815* (2013.01)

(58) Field of Classification Search
CPC . H01L 2224/13564; H01L 2224/13582; H01L 2224/13611; H01L 2224/13639; H01L 2224/13647; H01L 2224/13655; H01L 2224/13657; H01L 2224/1368; H01L 2224/13684; H01L 2224/81815; H01L 24/05; H01L 2224/02126; H01L 2224/0401; H01L 2224/05572; H01L 24/16; H01L 23/3114; H01L 23/49572; H01L 24/29; H01L 24/32; H01L 24/73; H01L 24/75; H01L 24/92; H01L 2224/05124; H01L 2224/05144; H01L 2224/05147; H01L 2224/05155; H01L 2224/05164; H01L 2224/05166; H01L 2224/05169; H01L 2224/05184; H01L 2224/05186; H01L 2224/05624; H01L 2224/05644; H01L 2224/05647; H01L 2224/05655; H01L 2224/05664; H01L 2224/05669; H01L 2224/05686; H01L 2224/113; H01L 2224/11312; H01L 2224/1132; H01L 2224/11464; H01L 2224/1147; H01L 2224/11505; H01L 2224/11552; H01L 2224/1181; H01L 2224/11849; H01L 2224/13082; H01L 2224/13111; H01L 2224/1354; H01L 2224/16225; H01L 2224/16245; H01L 2224/16503; H01L 2224/32225; H01L 2224/75272; H01L 2224/81191; H01L 2224/81948; H01L 2224/92125; H01L 24/11; H01L 2224/11318; H01L 2224/81447; H01L 2924/181
See application file for complete search history.

(56) References Cited

U.S. PATENT DOCUMENTS

| | | |
|---|---|---|
| 9,443,813 B1 | 9/2016 | Hsiao et al. |
| 9,520,370 B2 | 12/2016 | Gandhi |
| 9,698,119 B2 | 7/2017 | Noma et al. |
| 10,763,231 B2 * | 9/2020 | Mishra ............... H01L 23/3157 |
| 2006/0273450 A1 | 12/2006 | Shi et al. |
| 2012/0270369 A1 | 10/2012 | Chuang et al. |
| 2014/0090880 A1 | 4/2014 | Chen et al. |
| 2016/0260681 A1 | 9/2016 | Noma et al. |
| 2017/0148753 A1 | 5/2017 | Choi et al. |
| 2018/0090459 A1 | 3/2018 | Kim et al. |

* cited by examiner

BUMP BOND STRUCTURE FOR ENHANCED ELECTROMIGRATION PERFORMANCE

This application is a divisional of U.S. patent application Ser. No. 16/047,888, filed Jul. 27, 2018, the contents of which are herein incorporated by reference in its entirety.

FIELD OF THE DISCLOSURE

This disclosure relates to the field of microelectronic devices. More particularly, this disclosure relates to bump bond structures in microelectronic devices.

BACKGROUND OF THE DISCLOSURE

Microelectronic devices commonly have bump bond structures with tin-containing solder on copper pillars to provide connections to lead frames, chip carriers, and such. During operation of the microelectronic devices, current densities of $10^3$ amps/cm$^2$ to $10^5$ amps/cm$^2$ through the bump bond structures may lead to device failures. At these current densities, electromigration combined with ohmic heating in the copper pillar bump bond structures facilitate atomic diffusion of copper into the solder to form copper-tin intermetallic compounds (IMCs) such as $Cu_6Sn_5$ and $Cu_3Sn$. Formation of the IMCs involves volume shrinkage, leading to formation of voids. Voids may accumulate in the bump bond structures, resulting in device failures.

One common practice is to use a barrier metallurgy (such as Ni) to inhibit copper diffusion leading to void initiation and growth. Using a barrier metallurgy slows down the dissolution of the copper into the solder joint but does not stop it completely. Electromigration failures may occur at a later stage.

SUMMARY OF THE DISCLOSURE

The present disclosure introduces a microelectronic device having a pillar connected to an external terminal by an intermetallic joint. Either the pillar or the external terminal, or both, includes copper in direct contact with the intermetallic joint. The intermetallic joint includes at least 90 weight percent of at least one copper-tin intermetallic compound (IMC). The intermetallic joint is free of voids having a combined volume greater than 10 percent of a volume of the intermetallic joint; and the intermetallic joint is free of a void having a volume greater than 5 percent of the volume of the intermetallic joint. The microelectronic device may be formed by reflowing solder which includes at least 93 weight percent tin, 0.5 weight percent to 5.0 weight percent silver, and 0.4 weight percent to 1.0 weight percent copper, to form a solder joint between the pillar and the external terminal. The solder joint is subsequently thermally aged to convert the solder joint to the intermetallic joint.

DETAILED DESCRIPTION OF EXAMPLE EMBODIMENTS

Figure 1A:
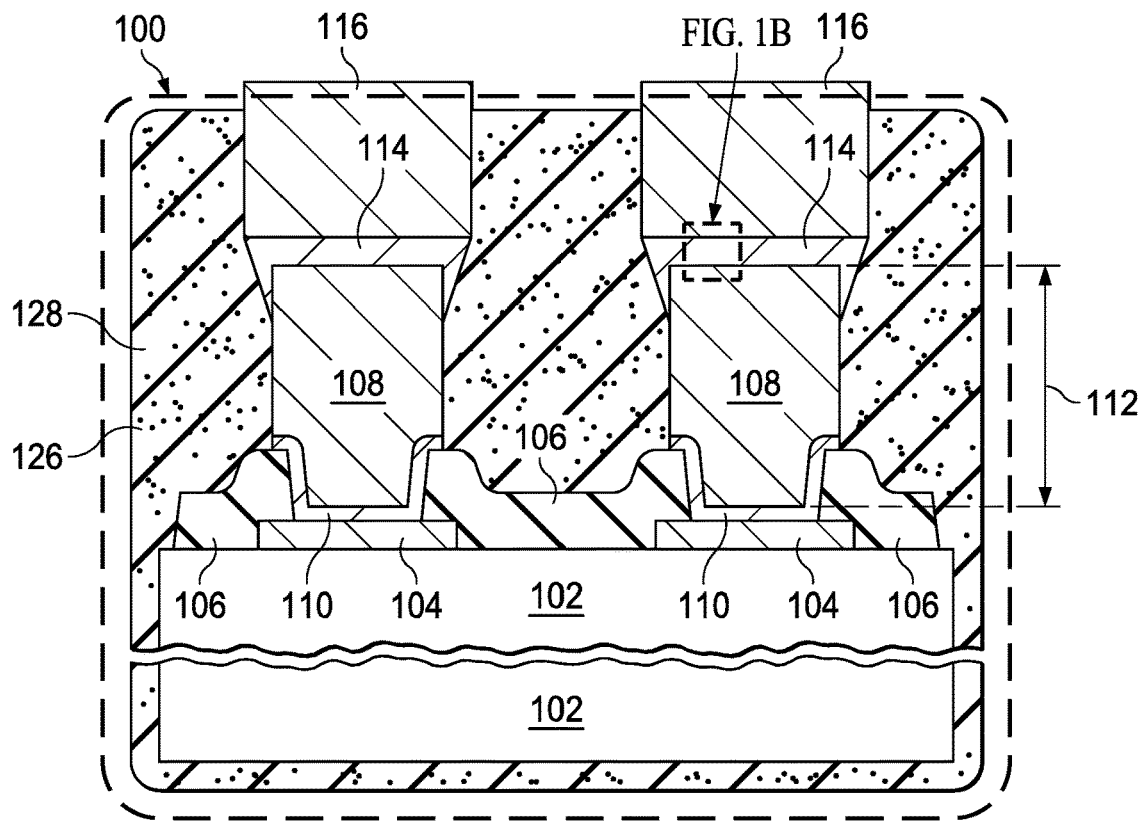
FIG. 1A and FIG. 1B are cross sections of an example microelectronic device including a copper pillar connected to an external terminal through an intermetallic joint.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device has a pillar connected to an external terminal by an intermetallic joint. Either the pillar or the external terminal, or both, include copper in direct contact with the intermetallic joint. In one aspect, the pillar may be a copper-containing pillar which includes at least 90 weight percent copper, and is referred to hereinafter as the copper pillar. The external terminal may be manifested as a lead of a lead frame, a metal line of a chip carrier, a trace of a printed circuit board, or such. The intermetallic joint includes at least 90 weight percent of at least one copper-tin intermetallic compound (IMC), such as $Cu_6Sn_5$ or $Cu_3Sn$. The intermetallic joint is free of voids having a combined volume greater than 10 percent of a volume of the intermetallic joint; and the intermetallic joint is free of a contiguous void having a volume greater than 5 percent of the volume of the intermetallic joint. A void is a region in the intermetallic joint that does not contain solid matter. The void may include gaseous material, such as air, hydrocarbon vapor, or water vapor. The intermetallic joint may be formed by reflowing solder which includes at least 93 weight percent tin, 0.5 weight percent to 5.0 weight percent silver, and 0.4 weight percent to 1.0 weight percent copper, to form a solder joint between the copper pillar and the external terminal. The solder joint is subsequently heated, causing copper to diffuse from the copper pillar or the external lead, or both, to react with the tin in the solder joint and convert the solder joint to the intermetallic joint.

For the purposes of this disclosure, the terms "lateral" and "laterally" are understood to refer to a direction parallel to a plane of the surface of the die on which the pillar located. Terms such as "top" and "over" as used in this disclosure should not be construed as limiting the position or orientation of a structure or element, but should be used to provide spatial relationship between structures or elements.

For the purposes of this disclosure, it will be understood that, if an element is referred to as being "on" or "onto" another element, it may be located directly on or disposed directly onto the other element, or intervening elements may be present. If an element is referred to as being "directly on" or "directly onto" another element, it is understood there are no other intentionally disposed intervening elements present.

For the purposes of this disclosure, terms describing elemental formulas of materials such as $Cu_6Sn_5$ and $Cu_3Sn$ do not imply a strict stoichiometry of the elements to the exclusion of other elements, but rather express a general quantitative relationship of the elements in the elemental formulas. By way of example, the copper-tin IMCs $Cu_6Sn_5$ and $Cu_3Sn$ may include some silver from the solder used to form the intermetallic joint. Moreover, a ratio of copper to tin in the copper-tin IMC $Cu_6Sn_5$ may be a few atomic percent different from 5:6. Similarly, a ratio of copper to tin in the copper-tin IMC $Cu_3Sn$ may be a few atomic percent different from 3:1.

Figure 1B:
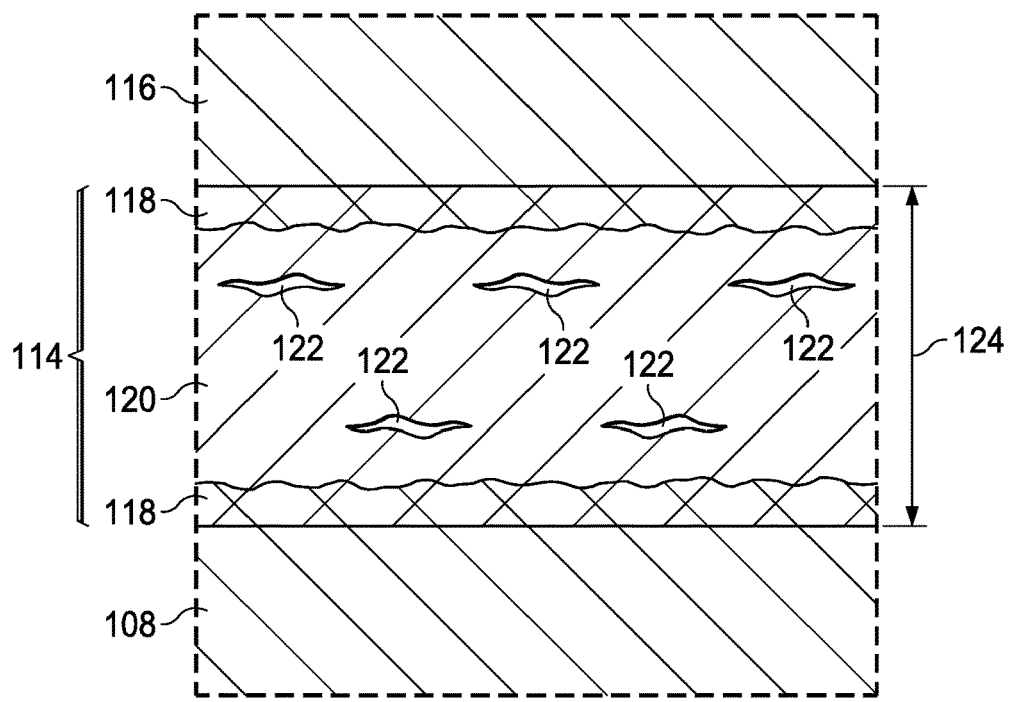

FIG. 1A and FIG. 1B are cross sections of an example microelectronic device including a copper pillar connected to an external terminal through an intermetallic joint. Referring to FIG. 1A, the microelectronic device 100 includes a die 102, which may be manifested, by way of example, as an integrated circuit die, a discrete transistor die, a microelectrical mechanical systems (MEMS) die, an optoelectronic die, or a sensor die. The microelectronic device 100 includes terminals 104 on the die 102. The terminals 104 may be manifested, for example, as input/output (I/O) terminals, power terminals, ground terminals, or a combination thereof. The terminals 104 may include aluminum or copper pads, and may include one or more layers of titanium nitride, tantalum nitride, nickel, palladium, gold, platinum, or other metal suitable for the terminals 104. The terminals 104 may be manifested as bond pads, bond areas of top interconnect layers of the microelectronic device 100, bond areas of a redistribution layer (RDL), or such. The microelectronic device 100 may optionally include a protective overcoat (PO) layer 106 on the die 102 which exposes the terminals 104. The PO layer 106, if present, may include silicon dioxide, silicon nitride, silicon oxynitride, polyimide, or other dielectric material suitable for reducing contamination of the die 102 or protecting the die 102 from mechanical damage.

The microelectronic device 100 includes copper pillars 108 which are electrically coupled to the terminals 104. The copper pillars 108 include at least 90 weight percent copper. The copper pillars 108 may include substantially all copper, or may include other metals such as silver, gold, or nickel, to improve mechanical strength of the copper pillars 108 or reduce electrical resistance of the copper pillars 108. In the instant example, seed layers 110 are between the terminals 104 and the copper pillars 108, so that the copper pillars 108 are electrically coupled to the terminals 104 through the seed layers 110. The seed layers 110 may include, by way of example, an adhesion sublayer with titanium or titanium tungsten, and a plating sublayer of copper or other metal providing a suitable surface for an electroplating operation. Alternatively, the copper pillars 108 may be located directly on the terminals 104. The copper pillars 108 have a height 112 of 10 microns to 75 microns, by way of example.

The microelectronic device 100 further includes intermetallic joints 114 which connect the copper pillars 108 with external terminals 116. The external terminals 116 may be manifested as leads of a lead frame, as depicted in FIG. 1A, metal lines of a chip carrier, traces of a printed circuit board, or other electrically conductive elements external to the microelectronic device 100.

FIG. 1B is an enlarged view of a portion of one of the intermetallic joints 114. Each intermetallic joint 114 includes at least 90 weight percent of at least one copper-tin IMC, such as $Cu_6Sn_5$ or $Cu_3Sn$, which may reduce diffusion of copper in the intermetallic joint 114. All the tin in the intermetallic joint 114 may be alloyed with copper, so that the intermetallic joint 114 may be free of a region of tin that is not alloyed with copper. In one version of the instant example, the intermetallic joint 114 may have regions of $Cu_3Sn$ 118 adjacent to the copper pillar 108 and adjacent to the external terminal 116, and a region of $Cu_6Sn_5$ 120 between the regions of $Cu_3Sn$ 118. A majority of the $Cu_3Sn$ 118, that is, more than half of the $Cu_3Sn$ 118, may be located adjacent to the copper pillar 108 and adjacent to the external terminal 116, that is, within 2 microns of the copper pillar 108, or within 2 microns of the external terminal 116. The intermetallic joint 114 may include a limited volume of voids 122; a combined volume of the voids 122 is less than 10 percent of the volume of the intermetallic joint 114, and each void 122 has a volume less than 5 percent of the volume of the intermetallic joint 114. The 5 percent single void maximum volume and the 10 percent combined void volume, combined with having at least 90 weight percent of at least one copper-tin IMC, may advantageously reduce further formation of voids and thus may provide increased reliability for the microelectronic device 100 compared to a joint having less copper-tin IMC or more voids. The intermetallic joints 114 may include 0.1 weight percent to 5 weight percent silver from a solder used to form the intermetallic joints 114. The intermetallic joint 114 may have a thickness 124 between the corresponding copper pillar 108 and the external terminal 116, that is 20 percent to 40 percent of the height 112 of the corresponding copper pillar 108, which may reduce movement of the intermetallic joints 114 during periods of thermal stress between the die 102 and the external terminal 116, thus improving reliability of the microelectronic device 100. Having the thickness 124 greater than 20 percent of the height 112 of the corresponding copper pillar 108 may mechanically weaken the intermetallic joints 114. Having the thickness 124 less than 10 percent of the height 112 of the corresponding copper pillar 108 may lead to faulty intermetallic joints 114 due to uneven gaps between the corresponding copper pillars 108 and the external terminals 116.

Referring back to FIG. 1A, the microelectronic device 100 may include a dielectric material 126 laterally surrounding the intermetallic joints 114. The dielectric material 126 may advantageously provide mechanical support for the intermetallic joints 114, further improving reliability of the microelectronic device 100. The dielectric material 126 may extend from the die 102 to the external terminals 116, and may optionally surround the die 102, as depicted in FIG. 1A. The dielectric material 126 may include, by way of example, epoxy mold compound, encapsulant, or underfill. The dielectric material 126 may include inorganic dielectric particles 128 of silicon dioxide, aluminum oxide, boron nitride, or such, to provide additional mechanical support.

Figure 2A:
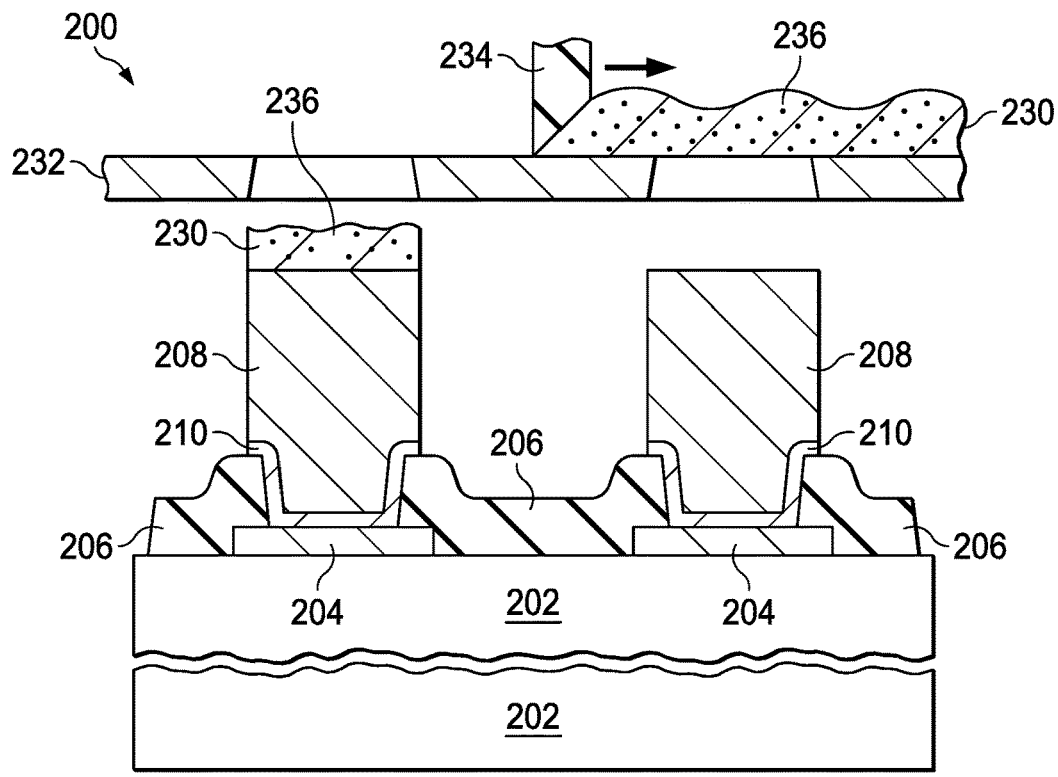
FIG. 2A through FIG. 2F are cross sections of a microelectronic device having an intermetallic joint, depicted in stages of an example method of formation.

FIG. 2A through FIG. 2F are cross sections of a microelectronic device having an intermetallic joint, depicted in stages of an example method of formation. Referring to FIG. 2A, the microelectronic device 200 includes a die 202. The die 202 may be a portion of a workpiece, such as a semiconductor wafer or a MEMS substrate, containing additional die. Alternatively, the die 202 may be separate from other die, by way of example as a result of a singulation process. Terminals 204 of the microelectronic device 200 are formed on the die 202. The terminals 204 may be formed with any of the materials disclosed in reference to the terminals 104 of FIG. 1A. An optional PO layer 206 of the microelectronic device 200 may be formed on the die 202 so as to expose the terminals 204. The PO layer 206 may be formed by forming one or more sublayers of protective material, such as silicon dioxide, silicon oxynitride, or silicon nitride, over the die 202, followed by a mask and etch operation to remove the protective material from over at least a portion of each terminal 204. Alternatively, the PO layer 206 may be formed by forming a layer of photosensitive protective material, such as photosensitive polyimide, over the die 202, followed by a photolithographic exposure and develop operation to remove the photosensitive protective material from over at least a portion of each terminal 204.

A seed layer 210 is formed over the die 202, on the PO layer 206, if present. The seed layer 210 contacts the terminals 204. The seed layer 210 may have one or more sublayers, such as an adhesion sublayer and a plating sublayer, as disclosed in reference to the seed layers 110 of FIG. 1A. The seed layer 210 may be formed by one or more sputter processes, evaporation processes, atomic layer deposition (ALD) processes, or such. The seed layer 210 provides a suitable surface for a subsequent electroplating process.

Copper pillars 208 of the microelectronic device 200 are formed on the seed layer 210. The copper pillars 208 may be formed by forming a plating mask which exposes the seed layer 210 in areas over the terminals 204, followed by electroplating copper on the seed layer 210 where exposed by the plating mask to form the copper pillars 208. The copper pillars 208 include at least 90 weight percent copper. The plating mask is subsequently removed, and the seed layer 210 is removed where exposed by the copper pillars 208, leaving the seed layer 210 between the copper pillars 208 and the terminals 204. In the instant example, the copper pillars 208 are left exposed during subsequent formation of solder bumps, that is, no barrier layers are intentionally formed on the copper pillars 208 to reduce diffusion of the copper from the copper pillars 208.

Other methods of forming the copper pillars 208 are within the scope of the instant example. In one version of the instant example, the copper pillars 208 may be formed using an additive process, such as an electrochemical deposition process, a material jetting process, a laser sintering process, or an electrostatic deposition process.

Solder paste 230 is disposed on the copper pillars 208. In the instant example, the solder paste 230 is disposed directly onto the copper pillars 208. The copper pillars 208 may be cleaned, to remove any oxide or contamination, prior to disposing the solder paste 230. The solder paste 230 may be disposed on the copper pillars 208 by a screen printing process, as depicted in FIG. 2A. The screen printing process uses a stencil 232 with apertures aligned with the copper pillars 208. A squeegee 234 pushes the solder paste 230 through the apertures and onto the copper pillars 208.

The solder paste 230 of the instant example includes solder particles 236 having an average size less than 5 microns. The solder particles 236 include at least 93 weight percent tin, 0.5 weight percent to 5.0 weight percent silver, and 0.4 weight percent to 1.0 weight percent copper. Limiting the average size of the solder particles 236 to less than 5 microns may enable disposing a desired amount of the solder paste 230 onto the copper pillars 208, to provide a desired thickness of a subsequently-formed intermetallic joint.

Figure 2B:
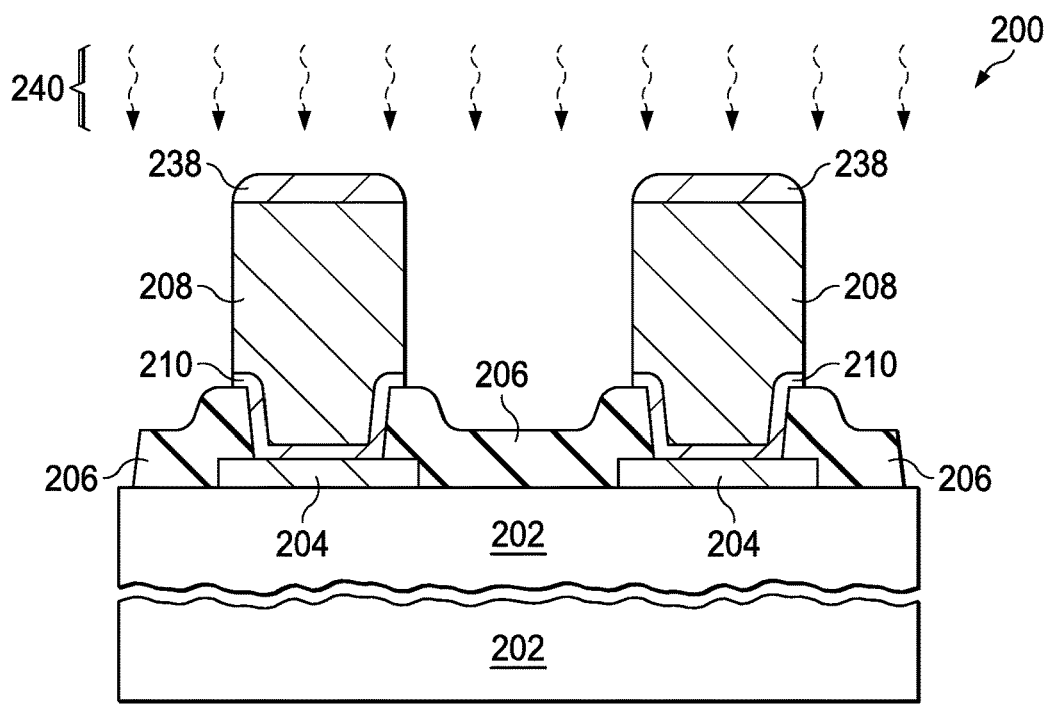

Referring to FIG. 2B, the solder paste 230 of FIG. 2A on the copper pillars 208 is heated by an initial reflow heating process 240 to remove volatile material and reflow the solder particles 236 of FIG. 2A to form solder bumps 238 on the copper pillars 208. The initial reflow heating process 240 may be implemented as a radiant heating process 240, as indicated schematically in FIG. 2B. Alternatively, the initial reflow heating process 240 may be implemented as an oven process, or a forced ambient heating process. The initial reflow heating process 240 may be implemented in a vacuum environment to remove more of the volatile material. The solder bumps 238 may optionally be washed to remove undesired flux residue or other unwanted material from the solder paste 230.

Alternate methods of forming the solder bumps 238 are within the scope of the instant example. In one alternate version of the instant example, the solder bumps 238 may be formed by a dip process using a molten solder bath. In another alternate version, the solder bumps 238 may be formed by an additive process such as material jetting, electrostatic deposition, material extrusion, or directed energy deposition.

Figure 2C:
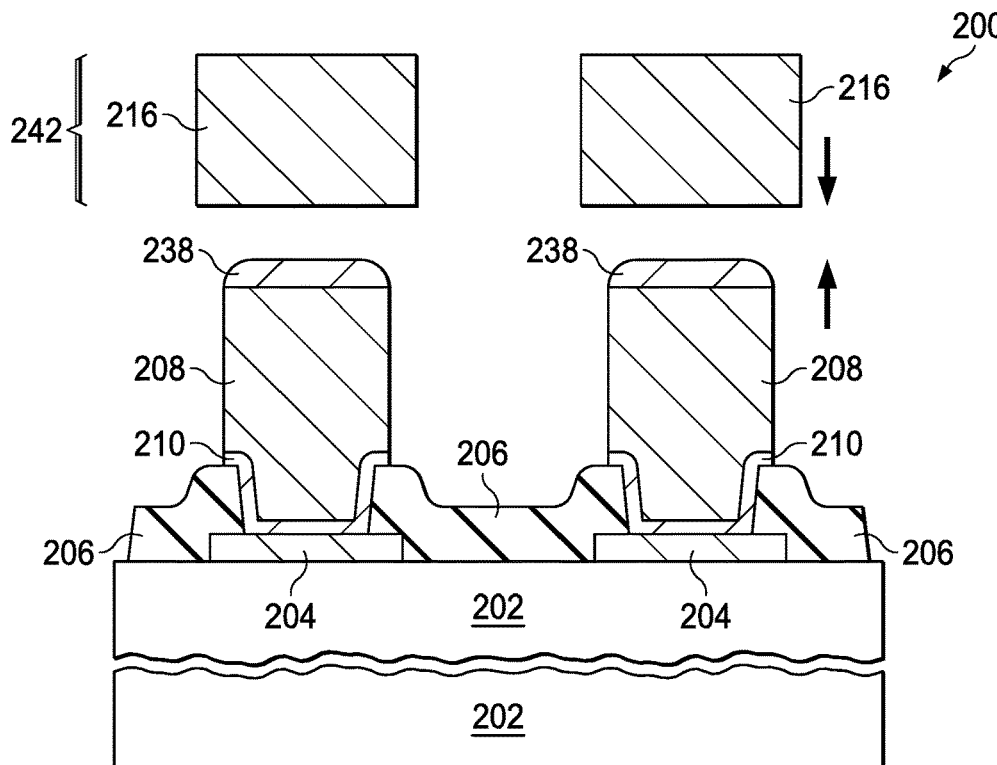

Referring to FIG. 2C, the microelectronic device 200 is assembled onto an external structure 242 having external terminals 216. The external structure 242 may be implemented as a lead frame 242 or an organic substrate, by way of example. The external terminals 216 may be implemented as external leads 216 of the lead frame 242 or the organic substrate. The external terminals 216 may include primarily copper or copper alloys.

Assembly of the microelectronic device 200 onto the external structure 242 is started by bringing the solder bumps 238 into contact with the external terminals 216, as indicated in FIG. 2C. The external terminals 216 may be free of barrier layers or other materials on a surface of the external terminals 216 in areas of contact with the solder bumps 238, so that the solder bumps 238 directly contact copper in the external terminals 216.

Figure 2D:
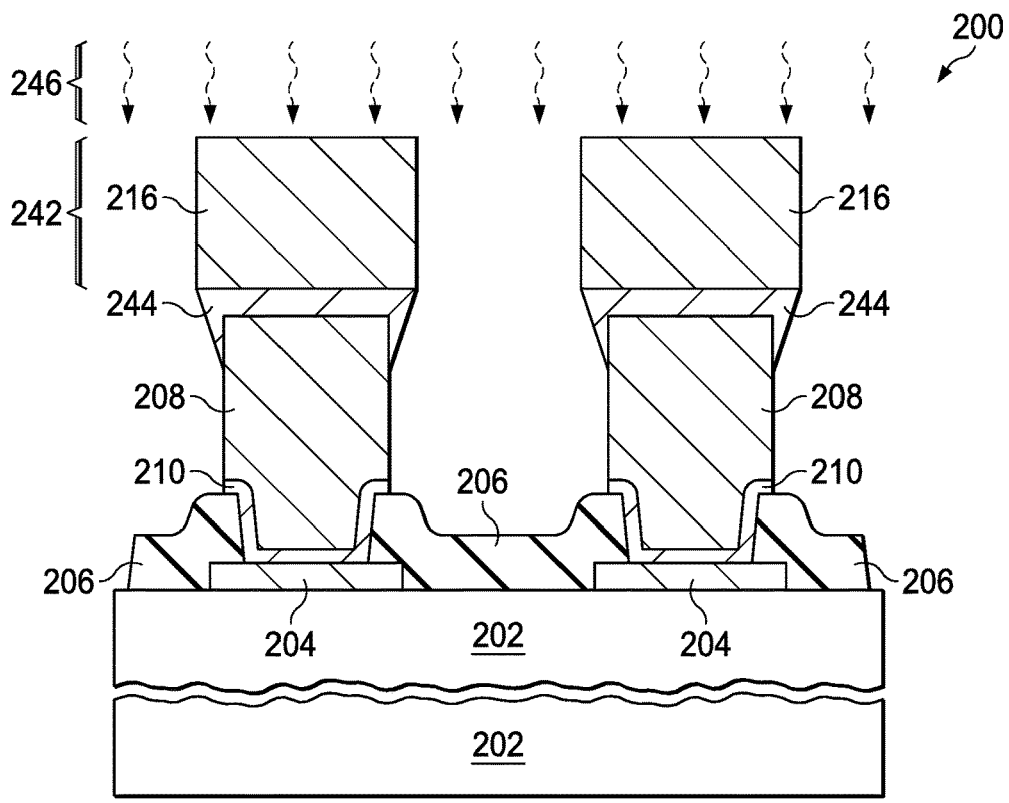

Referring to FIG. 2D, assembly of the microelectronic device 200 onto the external structure 242 is continued by heating the solder bumps 238 of FIG. 2C by a joint reflow heating process 246 to reflow the solder bumps 238, forming solder joints 244 between the copper pillars 208 and the external terminals 216. The joint reflow heating process 246 may be implemented as a forced ambient heating process 246, as indicated schematically in FIG. 2D, or may be implemented as another heating process, such as an oven heating process or a radiant heating process. In one version of the instant example, the joint reflow heating process 246 may be implemented with a non-oxidizing ambient, such as nitrogen, which may provide a desirable process cost. In another version, the joint reflow heating process 246 may be implemented in a vacuum environment, which may reduce formation of voids in the solder joints 244. The solder joints 244 may have compositions similar to compositions of the solder particles 236 of FIG. 2A, due to limited diffusion of copper from the copper pillars 208 when the solder joints 244 are formed.

Figure 2E:
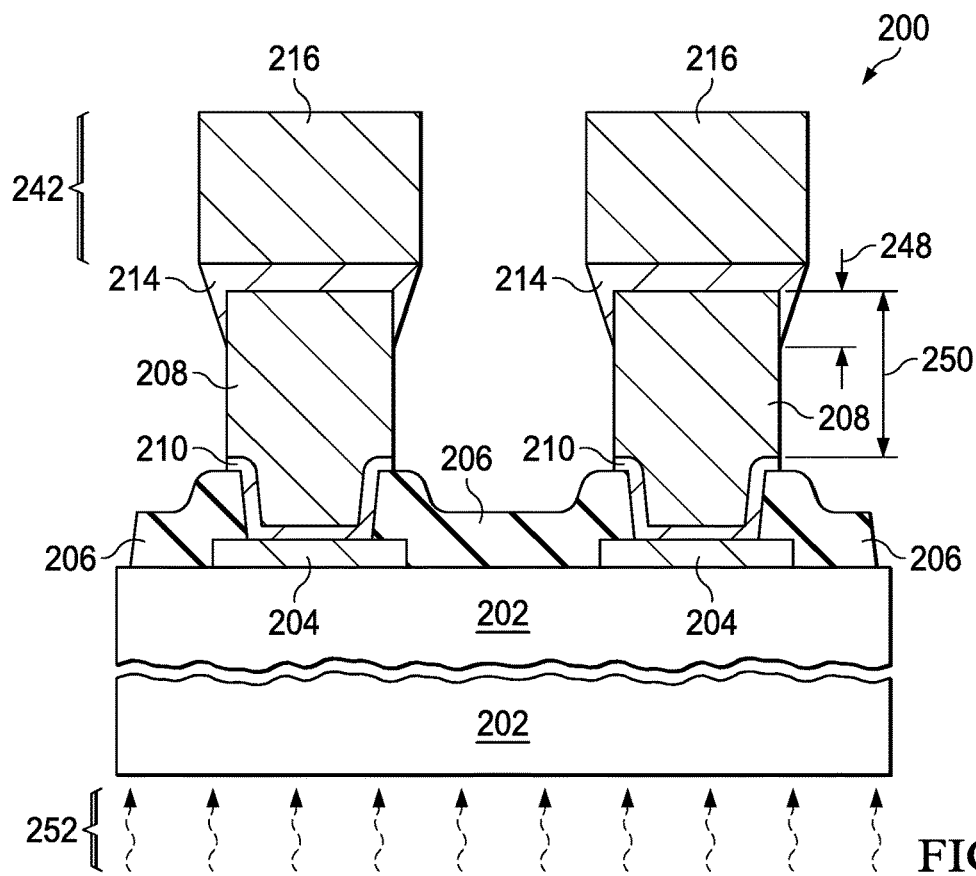

Referring to FIG. 2E, the solder joints 244 of FIG. 2D are heated by a thermal aging process 252, during which copper from the copper pillars 208 diffuses into the solder joints 244, and reacts with the tin in the solder joints 244, converting the solder joints 244 to intermetallic joints 214. Converting the solder joints 244 to the intermetallic joints 214 is a thermal process, so that the time required for the thermal aging process 252 is a function of the temperature to which the solder joints 244 are heated, with longer times required for lower temperatures. The copper in the solder joints 244 from the solder particles 236 of FIG. 2A helps initiate formation of the copper-tin IMCs, such as the $Cu_6Sn_5$ and the $Cu_3Sn$, advantageously providing a consistent rate of formation, and time to completion, of the intermetallic joints 214. In one version of the instant example, the thermal aging process 252 may include heating the solder joints 244 to a temperature of 220° C. to 260° C., a few degrees above a liquidus temperature of the solder in the solder joints 244. The liquidus temperature of the solder is a temperature at which crystals of tin alloy can co-exist with a liquid state of the solder in thermodynamic equilibrium. The liquidus temperature of the solder is a function of the specific composition of the solder. The thermal aging process 252 may be maintained for 30 minutes to 90 minutes, to fully convert the solder joints 244 to the intermetallic joints 214. In another version of the instant example, the thermal aging process 252 may include heating the solder joints 244 to a temperature of 150° C. to 180° C., and maintaining that temperature for 300 hours to 350 hours.

The thermal aging process 252 may be implemented as an oven process, a forced ambient heating process, or such. The thermal aging process 252 may be performed in a non-oxidizing ambient, such as nitrogen, argon, or such. In one version of the instant example, the thermal aging process 252 may be implemented as a continuation of the joint reflow heating process 246 disclosed in reference to FIG. 2D. In another version, the thermal aging process 252 may be implemented separately from the joint reflow heating process 246, with a cooling period between the thermal aging process 252 and the joint reflow heating process 246.

The intermetallic joints 214 may have the properties disclosed in reference to the intermetallic joints 114 of FIG. 1B. The intermetallic joints 214 may extend along lateral sides of the copper pillars 208 by lengths 248 that are up to half of lengths 250 of the lateral sides of the copper pillars 208, which may advantageously reduce current densities through interfaces between the copper pillars 208 and the intermetallic joints 214 during operation of the microelectronic device 200.

Figure 2F:
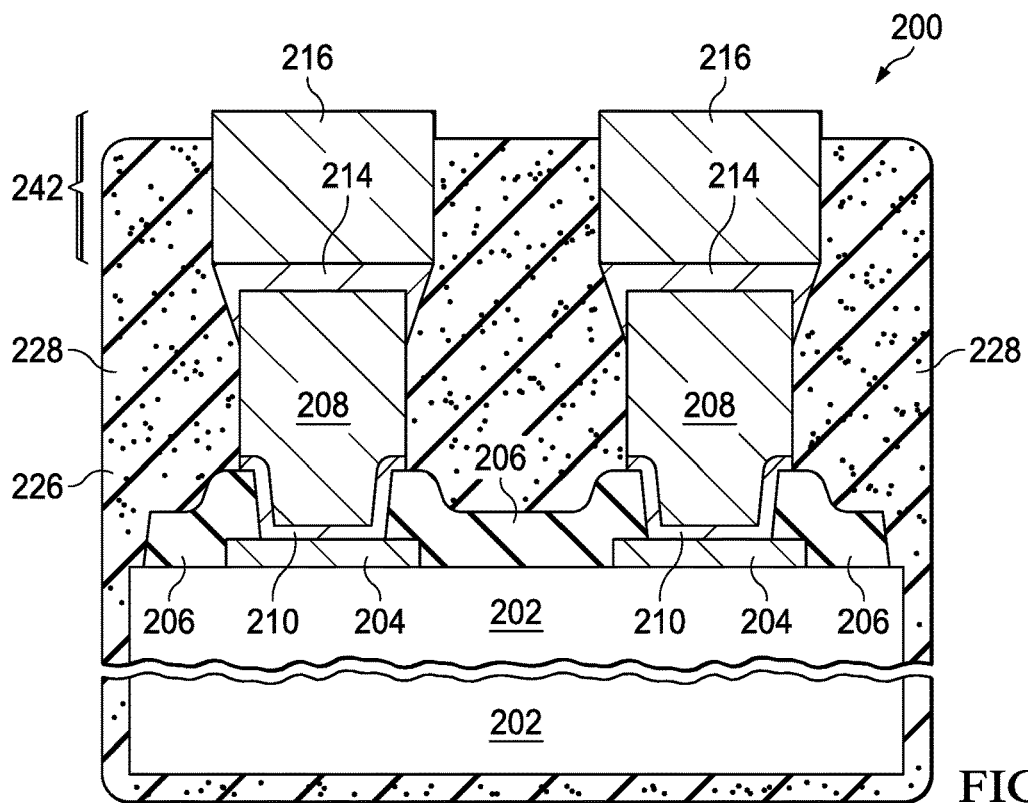

Referring to FIG. 2F, dielectric material 226 may be introduced into the microelectronic device 200 so as to laterally surround the intermetallic joints 214. The dielectric material 226 may extend from the die 202 to the external terminals 216, and may optionally surround the die 202. The dielectric material 226 may include any of the materials disclosed in reference to the dielectric material 126 of FIG. 1A, and may include inorganic dielectric particles 228 as disclosed in reference to the inorganic dielectric particles 128 of FIG. 1A. The dielectric material 226 may be introduced into the microelectronic device 200 by an injection molding process or other encapsulation process. The dielectric material 226 may be introduced into the microelectronic device 200 after the thermal aging process 252 of FIG. 2F is performed, to avoid thermal degradation of the dielectric material 226 by the thermal aging process 252.

Figure 3A:
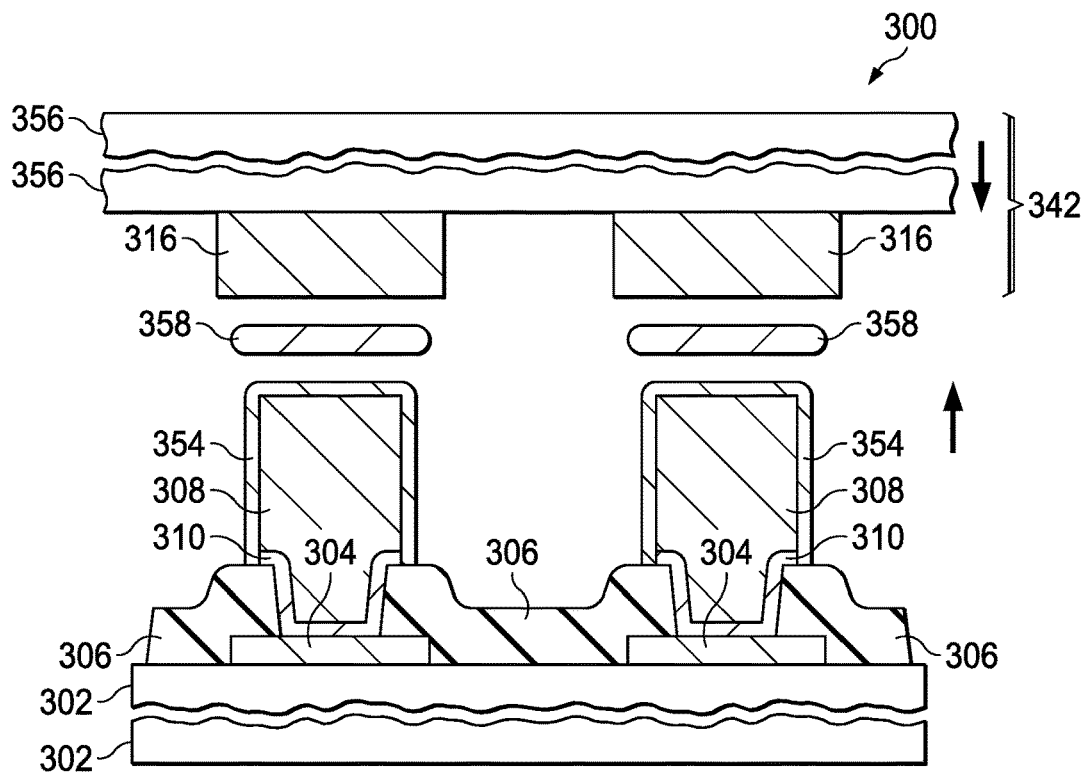
FIG. 3A through FIG. 3D are cross sections of a microelectronic device having an intermetallic joint, depicted in stages of another example method of formation.

FIG. 3A through FIG. 3D are cross sections of a microelectronic device having an intermetallic joint, depicted in stages of another example method of formation. Referring to FIG. 3A, the microelectronic device 300 includes a die 302, which may be implemented as a portion of a workpiece, or a singulated die. The microelectronic device 300 includes terminals 304 on the die 302. The microelectronic device 300 may optionally include a PO layer 306 on the die 302, exposing the terminals 304. A seed layer 310 is provided over the die 302, and on the PO layer 306, if present. The seed layer 310 contacts the terminals 304. Copper pillars 308 of the microelectronic device 300 are provided on the seed layer 310.

In the instant example, barrier layers 354 are provided on the copper pillars 308. The barrier layers 354 include electrically conductive materials, such as nickel, cobalt, tungsten, or molybdenum, or alloys thereof, which reduce diffusion of copper across the barrier layers 354. In one version of the instant example, the barrier layers 354 may substantially cover the copper pillars 308 where exposed by the seed layer 310, as depicted in FIG. 3A. In another version, the barrier layers 354 may cover portions of the copper pillars 308, for example, top surfaces of the copper pillars 308 opposite from the seed layer 310. The barrier layers 354 may be formed, by way of example, by an electroplating process, or by an electroless plating process.

The microelectronic device 300 is assembled onto an external structure 342 having external terminals 316. The external structure 342 may be implemented as a circuit board 342 having a circuit substrate 356, by way of example, and the external terminals 316 may be implemented as copper traces 316 on the circuit substrate 356. The external terminals 316 of the instant example include primarily copper, and are free of barrier layers or other materials on a surface of the external terminals 316.

In the instant example, solder preforms 358 are disposed between the copper pillars 308 and the external terminals 316. The solder preforms 358 have a composition as disclosed in reference to the solder particles 236 of FIG. 2A. Alternatively, solder paste, having the composition as disclosed in reference to the solder paste 230 of FIG. 2A, may be disposed on the copper pillars 308 or on the external terminals 316.

Assembly of the microelectronic device 300 onto the external structure 342 is started by bringing the barrier layers 354 on the copper pillars 308 into contact with the solder preforms 358, and bringing the solder preforms 358 into contact with the external terminals 316, as indicated in FIG. 3A. The solder preforms 358 directly contact copper-containing metal in the external terminals 316.

Figure 3B:
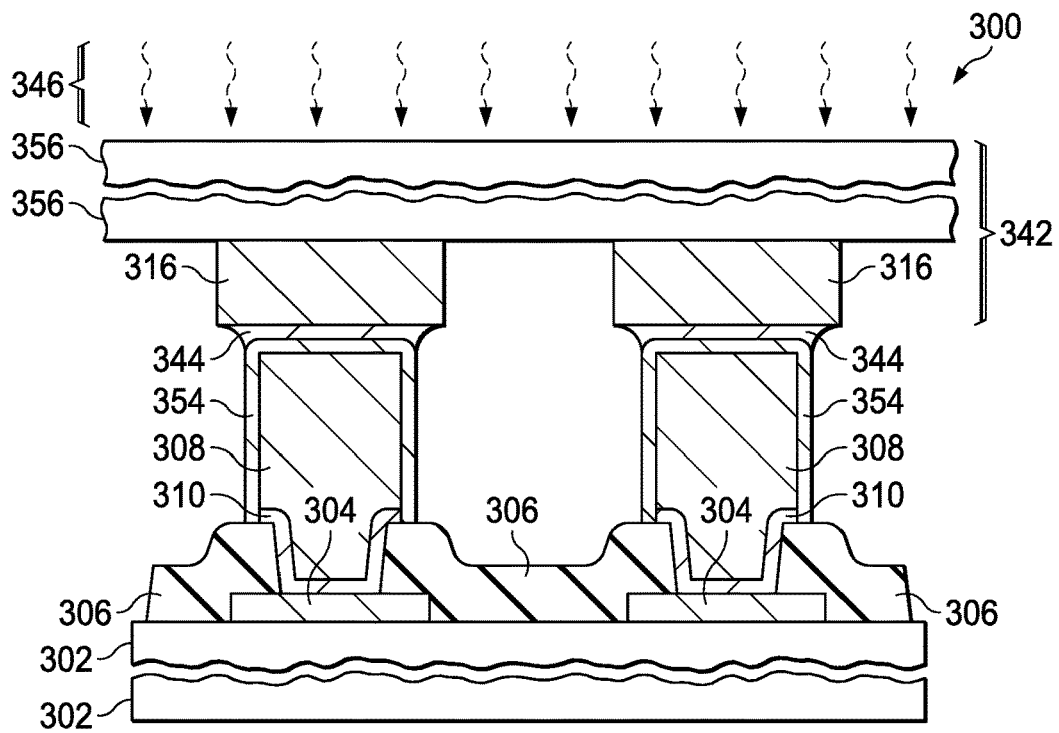

Referring to FIG. 3B, assembly of the microelectronic device 300 onto the external structure 342 is continued by heating the solder preforms 358 of FIG. 3A by a joint reflow heating process 346 to form solder joints 344 between the barrier layers 354 on the copper pillars 308 and the external terminals 316. The joint reflow heating process 346 may be implemented, by way of example, as a forced ambient heating process, an oven heating process, or a radiant heating process. The solder joints 344 may have compositions similar to compositions of the solder preforms 358 of FIG. 3A, due to limited diffusion of copper from the external terminals 316 when the solder joints 344 are formed.

Figure 3C:
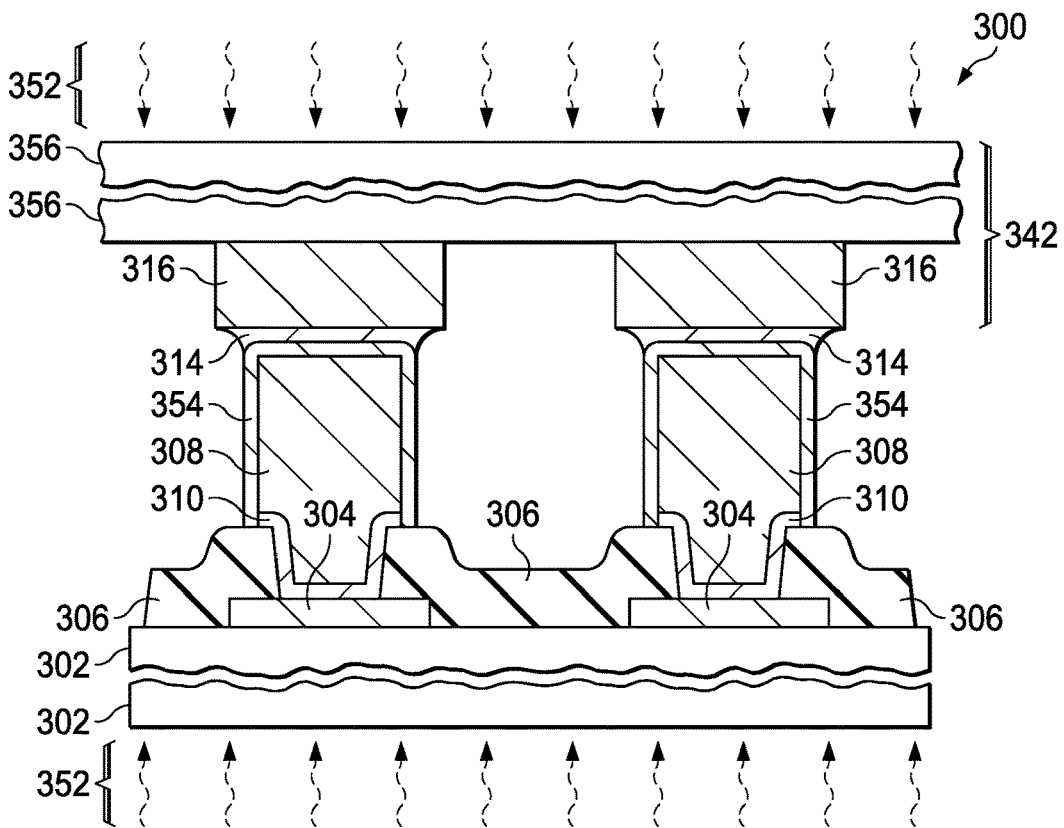

Referring to FIG. 3C, the solder joints 344 of FIG. 3B are heated by a thermal aging process 352, during which copper from the external terminals 316 diffuses into the solder joints 344, and reacts with the tin in the solder joints 344, converting the solder joints 344 to intermetallic joints 314. Diffusion of copper from the copper pillars 308 is reduced by the barrier layers 354 and thus may not contribute significantly to formation of the copper-tin IMCs in the intermetallic joints 314. The thermal aging process 352 may be implemented as disclosed in reference to FIG. 2E. The copper in the solder joints 344 from the solder preforms 358 of FIG. 3A helps initiate formation of the copper-tin IMCs, such as the $Cu_6Sn_5$ and the $Cu_3Sn$, accruing the advantage of consistent formation of the intermetallic joints 314 as disclosed in reference to FIG. 2E. The thermal aging process 352 may be implemented as disclosed in reference to FIG. 2E. The intermetallic joints 314 may have the properties disclosed in reference to the intermetallic joints 114 of FIG. 1B. Formation of the intermetallic joints 314 by the method disclosed in the instant example may enable attaining the advantages of the intermetallic joints 314 for versions of the microelectronic device 300 which are provided with the barrier layers 354.

Figure 3D:
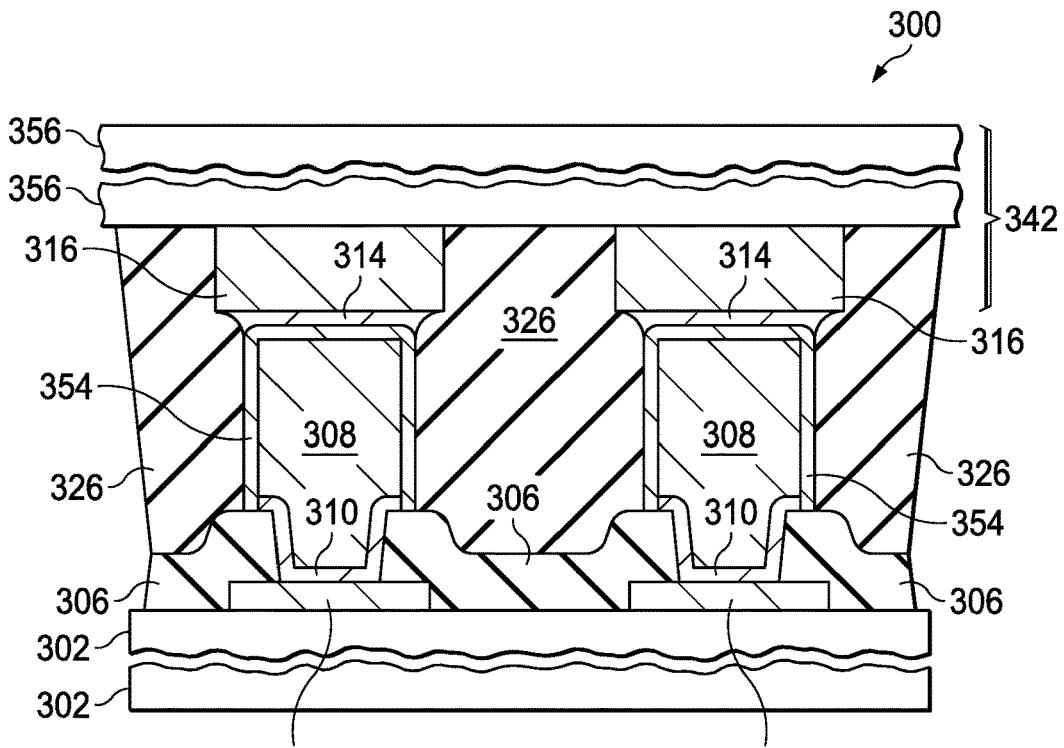

Referring to FIG. 3D, dielectric material 326 may be introduced into the microelectronic device 300 so as to laterally surround the intermetallic joints 314. The dielectric material 326 may extend from the die 302 to the external terminals 316, as depicted in FIG. 3D. The dielectric material 326 may include any of the materials disclosed in reference to the dielectric material 126 of FIG. 1A, and may include inorganic dielectric particles, not shown in FIG. 3D, as disclosed in reference to FIG. 1A. The dielectric material 326 may be introduced into the microelectronic device 300 by an underfill process or other encapsulation process. The dielectric material 326 may provide the advantages described in reference to FIG. 1A.

Various features of the examples disclosed herein may be combined in other manifestations of example integrated circuits. By way of example, the structures of FIG. 1A and FIG. 1B may be formed by a combination of the individual steps disclosed in reference to FIG. 2A through FIG. 2F and FIG. 3A through FIG. 3D.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a microelectronic device, comprising:
    forming a solder bump including solder directly on a copper-containing pillar, the copper-containing pillar being electrically coupled to a terminal of a die, the solder having at least 93 weight percent tin, 0.5 to 5.0 weight percent silver, and 0.4 to 1.0 weight percent copper;
    heating the solder bump to form a solder joint between the copper-containing pillar and an external lead; and
    thermally aging the solder joint by heating the solder joint to convert the solder joint to an intermetallic joint, wherein:
        the intermetallic joint includes at least 90 weight percent of at least one copper-tin intermetallic compound (IMC) selected from the group consisting of $Cu_6Sn_5$ and $Cu_3Sn$;
        the intermetallic joint is free of voids having a combined volume greater than 10 percent of a volume of the intermetallic joint; and
        the intermetallic joint is free of a void having a volume greater than 5 percent of the volume of the intermetallic joint.

2. The method of claim 1, wherein thermally aging the solder joint includes heating the solder joint to a temperature higher than a liquidus temperature of the solder, the liquidus temperature of the solder being a temperature at which crystals of tin alloy can co-exist with a liquid state of the solder in thermodynamic equilibrium.

3. The method of claim 1, wherein thermally aging the solder joint includes heating the solder joint to a temperature of 220° C. to 260° C., and maintaining the temperature for 30 minutes to 90 minutes.

4. The method of claim 1, wherein thermally aging the solder joint includes heating the solder joint to a temperature of 150° C. to 180° C., and maintaining the temperature for 300 hours to 350 hours.

5. The method of claim 1, wherein forming the solder bump includes disposing solder paste onto the copper-containing pillar, the solder paste including particles of the solder.

6. The method of claim 1, wherein the particles of the solder have an average size less than 5 microns.

7. A method of forming a microelectronic device, comprising:
    disposing solder between a pillar and an external lead, the pillar being electrically coupled to a terminal of a die, the external lead including copper, the solder having at least 93 weight percent tin, 0.5 to 5.0 weight percent silver, and 0.4 to 1.0 weight percent copper;
    heating the solder to form a solder joint between the pillar and an external lead; and
    thermally aging the solder joint by heating the solder joint to convert the solder joint to an intermetallic joint, wherein:
        the intermetallic joint includes at least 90 weight percent of at least one copper-tin intermetallic compound (IMC) selected from the group consisting of $Cu_6Sn_5$ and $Cu_3Sn$;
        the intermetallic joint is free of voids having a combined volume greater than 10 percent of a volume of the intermetallic joint; and
        the intermetallic joint is free of a void having a volume greater than 5 percent of the volume of the intermetallic joint.

8. The method of claim 7, wherein thermally aging the solder joint includes heating the solder joint to a temperature higher than a liquidus temperature of the solder, the liquidus temperature of the solder being a temperature at which crystals of tin alloy can co-exist with a liquid state of the solder in thermodynamic equilibrium.

9. The method of claim 7, wherein thermally aging the solder joint includes heating the solder joint to a temperature of 220° C. to 260° C., and maintaining the temperature for 30 minutes to 90 minutes.

10. The method of claim 7, wherein thermally aging the solder joint includes heating the solder joint to a temperature of 150° C. to 180° C., and maintaining the temperature for 300 hours to 350 hours.

11. The method of claim 7, wherein disposing the solder between the pillar and the external lead includes disposing solder paste onto the external lead, the solder paste including particles of the solder.

12. A method of forming a microelectronic device, comprising:
    forming a solder bump including solder directly on a copper-containing pillar, the copper-containing pillar being electrically coupled to a terminal of a die, the solder including tin, silver, and copper;
    heating the solder bump to form a solder joint between the copper-containing pillar and an external lead; and
    heating the solder joint to convert the solder joint to an intermetallic joint, wherein:
        the intermetallic joint includes at least one copper-tin intermetallic compound (IMC) selected from the group consisting of $Cu_6Sn_5$ and $Cu_3Sn$;
        the intermetallic joint is free of voids having a combined volume greater than 10 percent of a volume of the intermetallic joint; and
        the intermetallic joint is free of a void having a volume greater than 5 percent of the volume of the intermetallic joint.

13. The method of claim 12, wherein heating the solder joint includes heating to a temperature higher than a liquidus temperature of the solder, the liquidus temperature of the solder being a temperature at which crystals of tin alloy can co-exist with a liquid state of the solder in thermodynamic equilibrium.

14. The method of claim 12, wherein heating the solder joint includes heating the solder joint to a temperature of 220° C. to 260° C., and maintaining the temperature for 30 minutes to 90 minutes.

15. The method of claim 12, wherein heating the solder joint includes heating the solder joint to a temperature of 150° C. to 180° C., and maintaining the temperature for 300 hours to 350 hours.

* * * * *